United States Patent [19]

Norwood et al.

[11] Patent Number: 4,656,613

[45] Date of Patent: Apr. 7, 1987

[54] SEMICONDUCTOR DYNAMIC MEMORY DEVICE WITH DECODED ACTIVE LOADS

[75] Inventors: Roger D. Norwood, Sugar Land, Tex.; Chitranjan Reddy, Sunnyvale, Calif.

[73] Assignee: Texas Instruments Incorporated, Dallas, Tex.

[21] Appl. No.: 645,580

[22] Filed: Aug. 29, 1984

[51] Int. Cl.$^4$ .............................................. G11C 7/02
[52] U.S. Cl. .................................. 365/208; 365/203; 365/210
[58] Field of Search ............... 365/203, 205, 207, 208, 365/210

[56] References Cited

U.S. PATENT DOCUMENTS

4,233,675  11/1980  Karp et al. .......................... 365/205
4,366,559  12/1982  Misaizu et al. ..................... 365/205
4,370,575   1/1983  McAlexander, III ......... 365/205 X

*Primary Examiner*—Joseph A. Popek
*Attorney, Agent, or Firm*—John G. Graham

[57] ABSTRACT

A semiconductor dynamic memory device contains differential sense amplifiers for detecting the charge on bit lines, and active pull-up circuits for restoring bit lines to a full 1 level. The pull-up circuits are not activated on the dummy cell sides, however, because the power used to restore the dummy cell would be wasted since the dummy cell capacitors are always discharged. The device illustrated uses folded bit lines and multiplexed sense amplifiers; one of two opposite pairs of bit lines is selected. The two opposite pairs share precharge and active pull-up circuits on one side of the array, and share column output lines on the opposite side. The multiplex circuitry selects one side or the other for sensing, and also couples precharge and boost voltages or read/write data back and forth from one side of the sense amplifier to the other.

8 Claims, 8 Drawing Figures

SEMICONDUCTOR DYNAMIC MEMORY DEVICE WITH DECODED ACTIVE LOADS

BACKGROUND OF THE INVENTION

This invention relates to semiconductor memory devices and more particularly to an improved high-density MOS random access, dynamic read/write memory.

One of the most widely used memory devices for computers is the MOS dynamic RAM of the 64K-bit size, such as the device illustrated in U.S. Pat. No. 4,239,993, issued to McAlexander, White and Rao, assigned to Texas Instruments. As memory density in RAM devices of this type increases to the 256K-bit and 1-Megabit sizes, however, power dissipation in the integrated circuit becomes more of a problem. Power dissipation may be reduced by avoiding activation of circuits when not necessary; the active pull-up function is one example of such a circuit.

In the dynamic RAM of U.S. Pat. No. 4,239,993, the initial sensing voltage for the differential sense amplifier is established by connecting the storage capacitance to one bit line and a dummy capacitance to the other bit line. The sense amplifier is then activated, and the bit line with the lower voltage will be pulled to ground level by the sense amplifier. For reading a '1', the storage cell bit line remains high, and for reading a '0' the dummy cell side stays high. The high side does, however, lose some charge during sensing, so that it is not at the full Vdd potential. Thus, after sensing is complete, active pull-up circuits on the bit lines are activated to bring the high bit lines back up to a full Vdd level, so that the storage cells will be left with a full Vdd level for a stored '1'. Power is wasted in this step, however, in sense amplifiers that sensed a '0' level, since the active pull-up is activated on the dummy cell side of the sense amplifier and the bit-sense line is brought to a full Vdd. Any charge spent charging the dummy cell is wasted since all of the dummy cells are discharged to ground in the precharge cycle.

It is the principal object of this invention to provide improved sense amplifier circuitry for high-speed, high-density, low-power dynamic random access memory devices, particularly for reducing the power needed for the active pull-up function. Another object is to provide sense amplifier circuitry for a semiconductor dynamic memory device which uses active pull-up circcuits that are not operated when not needed. A further object is to provide an improved sense amplifier for a dynamic RAM circuit which conserves power in restoring or writing a full supply level into the selected storage cell.

SUMMARY OF THE INVENTION

In accordance with one embodiment of the invention, a semiconductor dynamic memory device contains differential sense amplifiers for detecting the charge on bit lines, and active pull-up circuits for restoring bit lines to a full 1 level. The pull-up circuits are not activated on the dummy cell sides, however, because the power used to restore the dummy cell would be wasted since the dummy cell capacitors are always discharged. The device illustrated uses folded bit lines and multiplexed sense amplifiers; one of two opposite pairs of bit lines is selected. The two opposite pairs share precharge and active pull-up circuits on one side of the array, and share column output lines on the opposite side. The multiplex circuitry selects one side or the other for sensing, and also couples precharge and boost voltages or read/write data back and forth from one side of the sense amplifier to the other.

By selectively activating the active pull-up circuits in this manner, power is saved in two ways. The dummy cells are not needlessly charged, and also the boost clock driver used in the active pull-up circuit drives only one-half the number of circuits.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
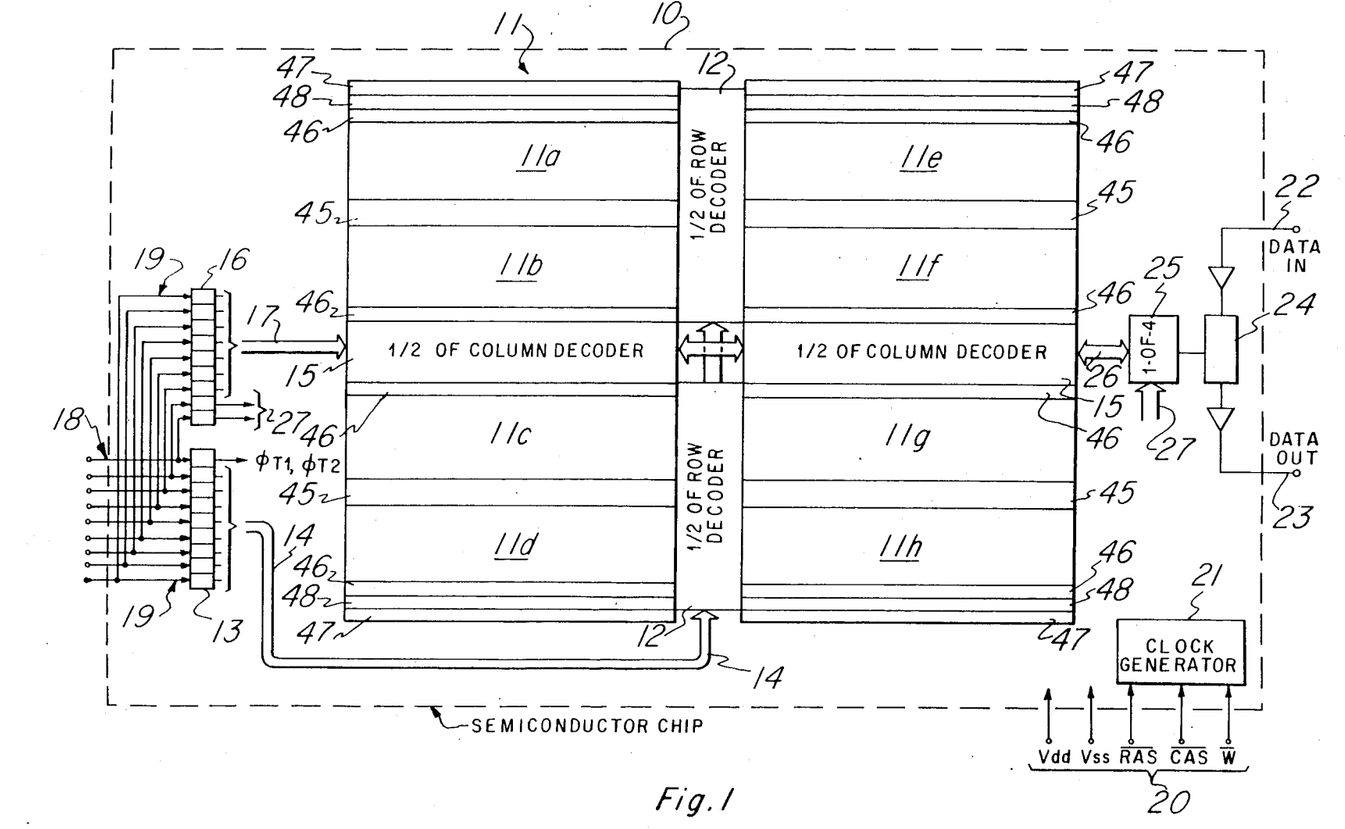
FIG. 1 is an electrical schematic diagram in block form of a semiconductor memory device empolying features of the invention.
Figures 2, 4:
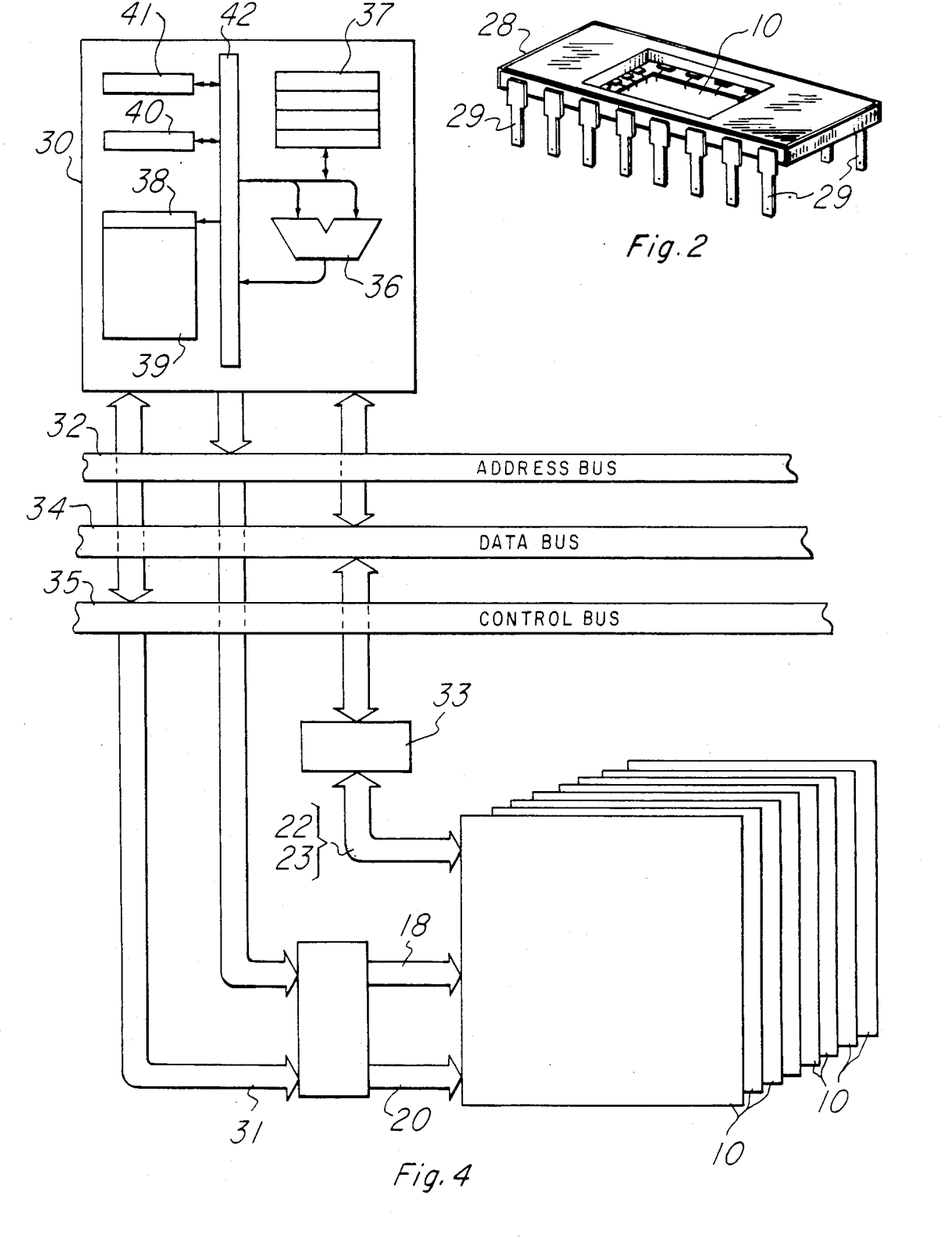
FIG. 2 is a pictorial view of a semiconductor package containing the device of FIG. 1.
FIG. 4 is a block diagram of a microprocessor system using the device of FIG. 1.

With reference to FIG. 1, one example of a semiconductor memory device that empolys the decoded active pull-up circuits of the invention is illustrated. This device is formed in a silicon chip 10 containing an array 11 of dynamic one-transistor memory cells. In this embodiment, the array contains "256K" or 262,144 cells, which if not partitioned would be a square array of 512×512 cells; the array is broken into eight arrays 11a–11h, however, with each of these containing 256 columns (256 pairs of bit lines) with sixty-four cells per bit line, or 2×256×64=32,768 cells. A row decoder 12 positioned between the arrays selects 4-of-1024 rows based upon an 8-bit row address received from a set of row address buffers 13 by lines 14. A 4-of-512 column select is performed by a Y decoder 15 which receives a seven bit column address from seven column buffers 16 via lines 17. A set of nine address input terminals 18 is connected to the row and column buffers 13 and 16 by lines 19. The address is multiplexed; the row address is gated into the buffers 13 when a row address strobe signal $\overline{RAS}$ drops to zero, and the column address is gated into the buffers 15 when a column address strobe signal $\overline{CAS}$ drops to zero. The $\overline{RAS}$ and $\overline{CAS}$ signals are applied to the chip by terminals 20 along with a read/write control $\overline{W}$, all these signals being connected to a clock generator 21 which produces all of the internal clocks. A supply voltage Vdd, usually +5 v, and ground Vss are also applied to the chip 10 by external terminals 20. A single-bit data input terminal 22 and a single-bit data output terminal 23 are connected to an I/O buffer and control circuit 24. A one-of-four column selector 25 connects one of the four sets of I/O lines 26 coming from the column decoder to the I/O control 24. This selector 25 receives two column address bits from the buffers 16 by lines 27. The semiconductor chip 10 is mounted in a sixteen-pin dual-in-line package 28 as seen in FIG. 2. Bonding pads on the chip 10 are connected by wires to interior pads for the sixteen pins 29, in accordance with the standard practice; of course, plastic packages or chip carriers may be used instead of the ceramic package of FIG. 2.

Figure 3A:
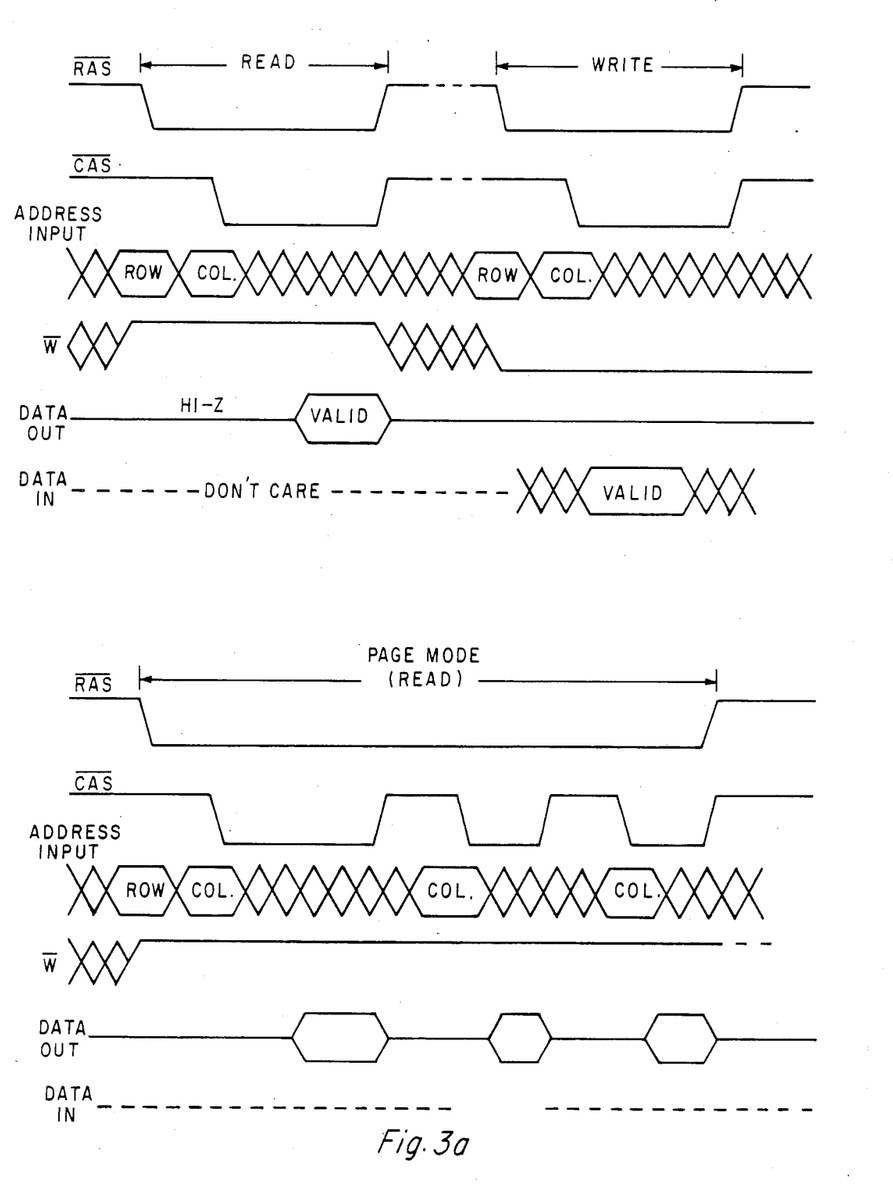
FIGS. 3a and 3b are timing diagrams for the device of FIG. 1.
Figure 3B:
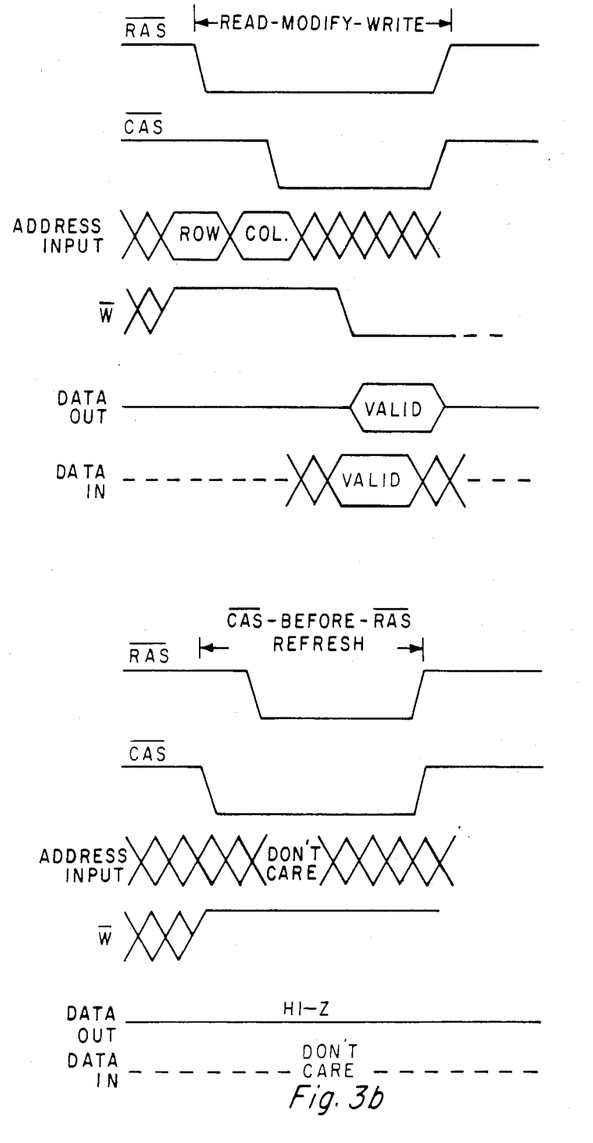

In FIG. 3 operations of the memory device are illustrated in a timing diagram. For a read operation, the W signal stays high, the address is valid on terminals 18 during the intervals shown, and data is valid on the output terminal 23 during a period after the $\overline{RAS}$ and $\overline{CAS}$ signals drop. At other times, the output buffer 24 holds the output terminal 23 in a high impedance state. A write operation is signalled by $\overline{W}$ going low, and in this case the data on input terminal 22 must be valid during the period indicated; the data output terminal 23 stays in the high impedance state. A page mode operation is defined when $\overline{RAS}$ stays low and $\overline{CAS}$ is cycled to gate in a sequence of column addresses. Although shown for read, the page mode operation can be a write instead. A read-modify-write operation occurs when the $\overline{W}$ signal drops after $\overline{CAS}$ goes low but before $\overline{RAS}$ and $\overline{CAS}$ go high, as seen in FIG. 3. A refresh operation occurs when $\overline{CAS}$ drops before $\overline{RAS}$, in which case an internal counter supplies a row address to the decoder 12 according to U.S. Pat. Nos. 4,207,618 and 4,344,157 issued to White and Rao, assigned to Texas Instruments; no column address is needed for refresh.

Referring to FIG. 4, a microprocessor system employing the memory device of FIG. 1 is illustrated. The microprocessor 30 which forms the CPU of the system may be, for example, a 9900 type made by Texas Instruments, a 6800 or 68000 type made by Motorola, or an 8600 type made by Intel. In this example, an eight bit data bus is discussed, although other architectures are appropriate, such as 16-bit. Eight of the chips 10 are used in parallel, providing a 256K-byte read/write memory. The eight memory chips 10 have the address terminals 18 coupled to a microprocessor 30 through a memory controller 31 and an address bus 32. The memory controller 31 is commercially available under part number TMS4050 for example, and functions to multiplex the addresses, generate $\overline{RAS}$ and $\overline{CAS}$, and to generate refresh addresses. The separate data-in and data-out terminals 22 and 23 of the chips 10 are coupled to the microprocessor 30 by conventional data latches 33 (part of memory controller) and an 8-bit bidirectional data bus 34. The control signal outputs 35 from the microprocessor 30 are usually controls such as data bus enable $\overline{DEN}$, memory enable $\overline{MEN}$, address latch $\overline{ALATCH}$, address latch enable ALE, read RD, write WR, read/write R/W or W, valid memory address VMA, address strobe AS, data strobe DS, etc., depending upon the manufacturer and type or part number of the microprocessor. These are not the same as the control terminals of the device 10 ($\overline{RAS}$, $\overline{CAS}$ and $\overline{W}$). The control outputs 34 of the microprocessor are used to generate the controls $\overline{RAS}$, $\overline{CAS}$ and $\overline{W}$ for the memory chips 10 and controls for the data latch 33 in the controller 31. A chip select control $\overline{CS}$, not shown, is usually generated external to the microprocessor by higher level address bits. In this example, however, the logical address range is assumed to be 18-bits, so the nine-bit row and column addresses are generated from the bus 32 by merely multiplexing. Likewise, the CAS before RAS refresh control may be generated externally, using a timer in the memory control 31, or it may be controlled by the microprocessor 30.

The processor 30 contains an ALU 36, a register file 37 and an instruction register 38, with control decode circuitry 39 to generate internal command signals and memory controls 35 for defining the operation based on an instruction in the instruction register 38. A program counter 40 contains the address of the next instruction, and this address is sent out by address bus 32 to fetch the next instruction word from memory 10 to be delivered back to the instruction register 38 by data bus 34. The program counter is incremented after each fetch to produce the address of the next instruction, or a new address is used in case of a branch, vector interrupt, or other non-sequential fetch. In like manner, a memory address register 41 contains an address of data to be fetched from memory 10. An internal bus structure 42 couples the various elements together as in U.S. Pat. No. 3,757,306, assigned to Texas Instruments.

In FIG. 1, the 256K-bit array 11 is split into eight blocks 11a–11h, each containing 32K cells. Between each pair of blocks is positioned a set of 256 sense amplifiers 45 for a total of 1024 sense amplifiers, and each sense amplifier is multiplexed. Intead of one sense amplifier for each pair of bit lines, each sense amplifier 45 is selectively connected to either of two pairs of bit lines, one pair on the left or one pair on the right of a sense amplifier. Rows of dummy cells 46 are positioned on the outer edges of the array blocks 11a–11h, furthest from the sense amplifiers 45. One set of precharge devices 47, and one set of the decoded active load devices 48 of the invention, are used for each pair of blocks such as 11a and 11b, 11e and 11f, etc. Thus, the bit lines in array block 11b are precharged through the bit lines of block 11a and the sense amplifiers 45. Likewise, the four pairs of data I/O lines 26 and associated Y decode 15 are located only on the interior edges of array blocks 11b, 11c, 11f and 11g, so data is read from or written into the outer blocks 11a, 11d, 11e and 11h by passing through the sense amplifier and opposite bit line halves.

Figure 5:
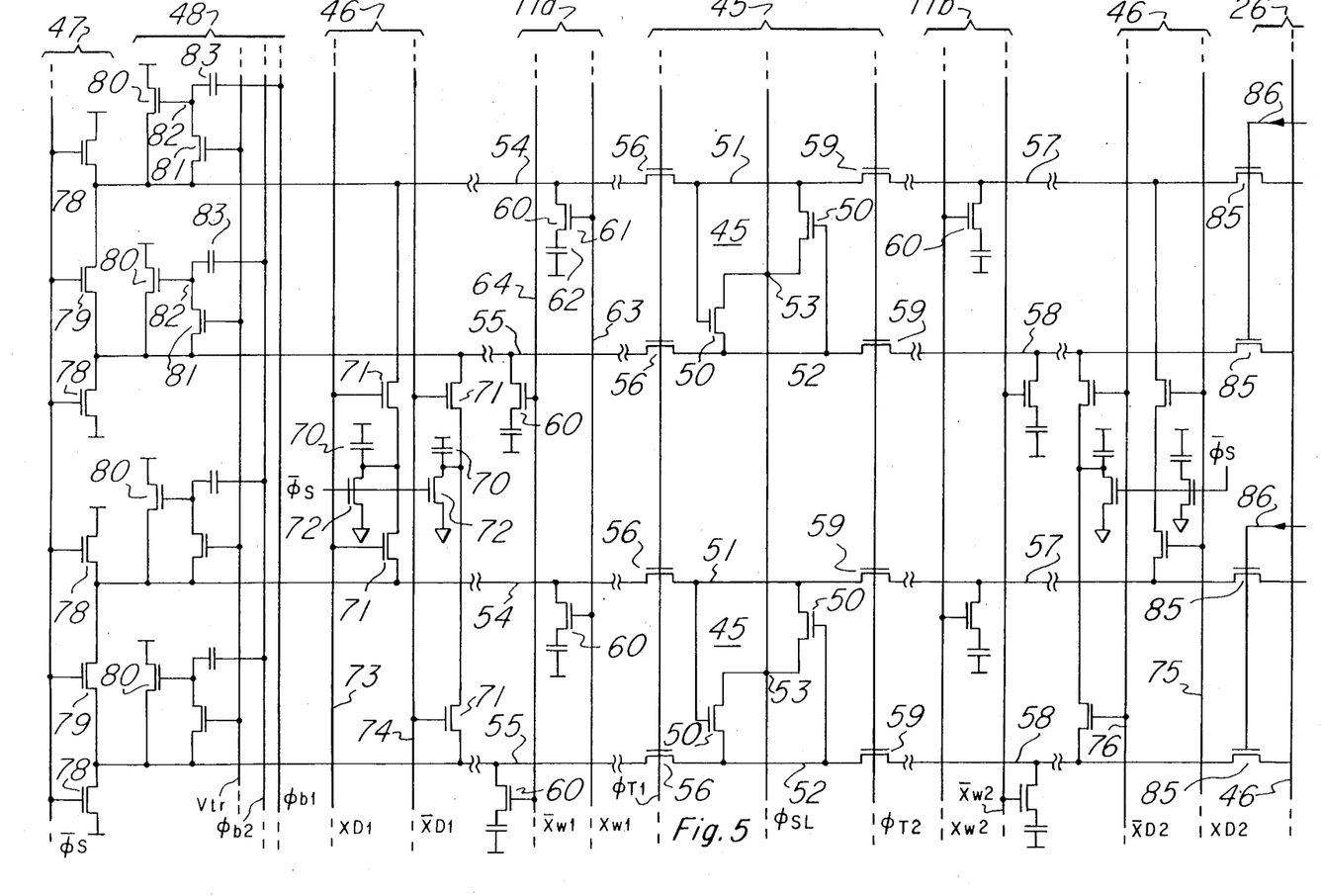
FIG. 5 is a detailed electrical diagram of the memory array circuitry of FIG. 1.

Referring to the detailed circuit diagram of FIG. 5, each sense amplifier 45 consists of a pair of cross-coupled driver transistors 50 which have their drains connected to sense nodes 51 and 52 and sources connected to a common grounding node 53. The nodes 51 and 52 are connected to a pair of bit lines 54 and 55 on the left by a pair of transistors 56 or connected to a pair of bit lines 57 and 58 on the right by a pair of coupling transistors 59. One-transistor type memory cells 60 are connected to the bit lines 54, 55, 57, 58 as illustrated; each cell includes an access transistor 61 and a storage capacitor 62. These cells preferably use metal bit lines for higher conductivity as illustrated in U.S. patent application Ser. No. 133,376 filed Mar. 21, 1980, assigned to Texas Instruments. The gates of all sixty-four access transistors 61 in each row of cells are all connected to a row line 63 or 64 on the left (or 65 or 66 on the right). There are sixty-four row lines 63, and sixty-four row lines 64 in array block 11a. The circuit seen in FIG. 5 has two sense amplifiers and four pairs of bit lines 54 and 55, but it will be understood that each pair of blocks such as 11a and 11b contains 256 of the sense amplifiers 45; each block such as 11a has 256 pairs of bit lines 54 and 55, along with 128 row lines 63 and 64.

The rows 46 of dummy cells consist of shared capacitors 70 which are full sized, i.e., the same size as the storage capacitors 62. The capacitors 70 are connected to two corresponding bit lines such as 54 or 55 in adjacent columns by access transistors 71. The dummy capacitors 70 are predischarged by transistors 72 having the precharge clock $\Phi S$ applied to their gates. The gates of the access transistors 71 for the dummy cell row for the bit lines 54 are connected to a dummy row address line 73, whereas the access transistors 71 for the dummy cells for lines 55 are connected to a dummy address line 74. Correspondingly, on the right-hand side, dummy cell address lines 75 and 76 are connected to the rows of dummy cell transistors. These address lines 73 and 74 are selectively activated; the row decoder 12 selects one of the four dummy cell address lines 73, 74, 75 or 76 depending upon which of the row address lines 63, 64, 65 or 66 is selected. For example, if the cell 60 to be read is on the upper left, the row line 63 will go high (XW1 goes high) and dummy address line 73 goes high (XD1). In this case, the sense node 51 is connected to bit line 54 and receives the bit stored in the memory cell capacitor 62, whereas the dummy capacitor 70 is connected to the bit line 55. The capacitance 70 is shared by two bit line 55, so each will drop by half the magnitude caused by a stored zero in a storage cell capacitor 62; the line 74 must go low before the latching operating begins so that the voltage on the other bit line from the adjacent column will not influence the selected bit line.

The bit lines 54, 55, 57 and 58 are all precharged from the left-hand side by transistors 78, and equallized by transistors 79, all of which have the precharge clock $\Phi s$ on the gates. The transistors 56 and 59 are all turned on by clocks $\Phi T1$ and $\Phi t2$ which are both above Vdd during the precharge part of the cycle, so the bit lines 57 and 58 on the right can be precharged and equallized from these circuits 47 on the far left.

In accordance with the invention, active pull-up circuits 48 including load transistors 80 for each bit line are located on one side of each pair of blocks of the array, (shared by both blocks), and these circuits are selectively activated; for the bit line of the storage cell side the active pull-up receives a boost clock $\Phi b$, but on the dummy cell side it does not. These active loads provide a function as disclosed in U.S. Pat. No. 4,701,081 issued to White, McAdams and Redwine or U.S. Pat. No. 4,399,293, issued to McAlexander, White and Rao, both assigned to Texas Instruments. The gates of the load transistors 80 are coupled to the bit lines 54 or 55 by the source-drain paths of transistors 81, and the gates of these transistors 81 have a trap voltage Vtr on their gates. The trap voltage is held at a level above Vdd during the precharge part of the cycle, then drops to a level of about two Vt below Vdd during the active part of the cycle in order to trap a voltage on the nodes 82 at the gates of the transistors 80. A boost clock $\Phi b1$ or $\Phi b2$ is applied to these nodes 82 by MOS gated capacitors 83; these clocks go high at about the time the latch operation is initiated in the latch transistors 50, or shortly after. The zero-going bit line will have dropped low enough to discharge the node 82, so this load transistor 80 will not turn on when the boost clock occurs (thus saving power) but for the one-going side the node 82 is boosted by $\Phi b$ to a level above Vdd so that this bit line half is pulled back up to Vdd by current through the load transistor 80.

The right-hand bit lines 57 and 58 selected by the column address are connected to data and data bar lines 46 by transistors 85 which have the column decode output applied to the gates by lines 86. The column decoder 15 has sixty-four of the output lines 86 for each quadrant of the array 11, so for a given 9-bit Y address, eight bits select four of 1024 lines 86 to go high; all others stay low. Thus, in each quadrant, two possible pairs of bit lines (54 and 55, or 57 and 58) are selected, and selection between these two pairs is by the $\Phi T1$, $\Phi T2$ clock, which is defined by the ninth X address bit. Thus, in a given cycle, four of 512 column is ultimately coupled to the lines 46.

Placing the sense amplifiers 45 between two pairs of bit lines 54 and 55, or 57 and 58, and isolating the unused one during sensing effectively reduces the bit line capacitance by a factor of two, thus doubling the signal generated on the bit line halves. The isolation is accomplished by pulling either $\Phi T1$ or $\Phi T2$ to ground, leaving the other at its boosted level from the previous cycle.

Placing the sense amplifier 45 between two pairs of bit lines means that the I/O lines 46 are then connected to the end of one pair of bit lines, so the capacitances of the bit lines 57 and 58 act as filters to attenuate any noise coupled from the column decoders 15 before the noise reaches the sense amplifier 45 itself. This filtering action enables the signal from the decoder 15 to come in sooner on the lines 86 during sensing. Sharing the dummy cell capacitors 70 between adjacent bit line pairs allows the dummy cell capacitance 70, thus layout size, to be equal to that of the storage capacitors 62, avoiding patterning problems and differences between the storage and reference cells due to moat encroachment of field implant encroachment.

Figure 6:
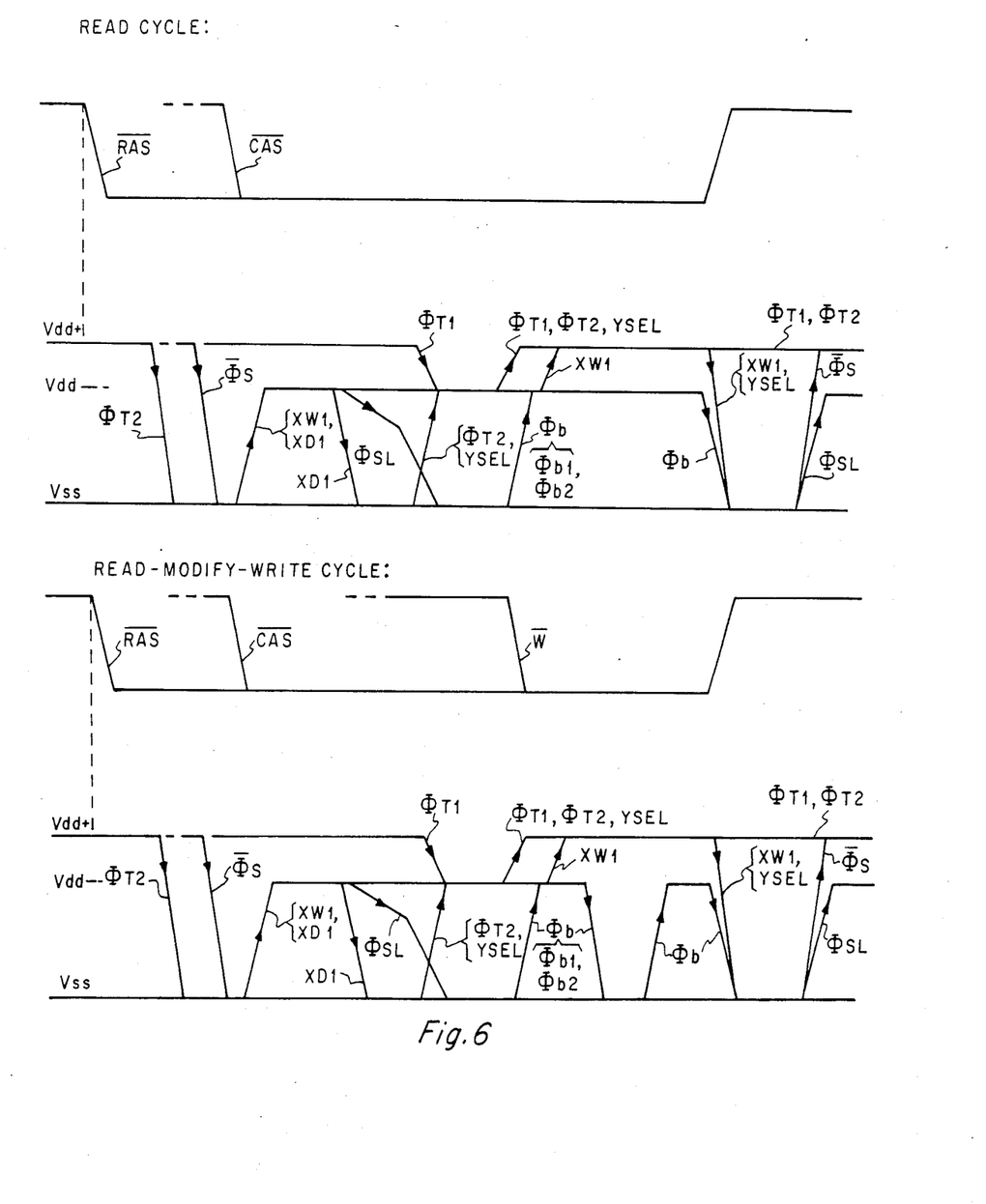
FIG. 6 is a graphic representation of voltage or event vs. time in operation of the device of FIGS. 1 and 5.

Referring to FIG. 6, the timing waveforms for all significant clocks are shown for a read cycle. The $\Phi T1$ and $\Phi T2$ waveforms are both booted to above Vdd from the previous cycle. In this case, a cell on the left side of FIG. 5 is being read from, so $\Phi T2$ fals to ground to isolate the right hand bit lines. The word lines are then turned on by XW1 or XW1 and sensing begins as $\Phi SL$ falls. The dummy word lines 73, etc., are turned off as sensing is done. The dummy cells must be isolated since they are shared between bit-sense lines that could be reading opposite data.

As sensing is being completed $\Phi T2$ is brought back up to Vdd and equalized there with $\Phi T1$. This action begins to propagate the read data over the right hand bit lines to the I/O lines 46. In FIG. 6, $\Phi T1$ and $\Phi T2$ are actively booted in the active portion of the cycle. This booting is not necessary, however, since $\Phi T1$ and $\Phi T2$ are self-booted by the bit lines as they are charged up to Vdd in the precharge portion of the cycle. This self-booting through the transfer devices 56 and 59 is the mechanism that allows for all four bit lines 54, 55, 57 and 58 to be precharged from the far left bit lines. With $\Phi T1$ and $\Phi T2$ booted to above Vdd and a metal-bit-line architecture, the right halves are equalized and charged to Vdd quite easily through transistors 56 and 59.

The clocks $\Phi T1$ and $\Phi T2$ need not be actively booted for the read cycle. However, with the write-activated active load 48, $\Phi T1$ and $\Phi T2$ need not be booted for a write stage. Notable is that $\Phi b1$ and $\Phi b2$ share a delay circuit, which assures that there will be no timing difference between the two, which avoids any pattern sensitivity problems.

Figure 7:
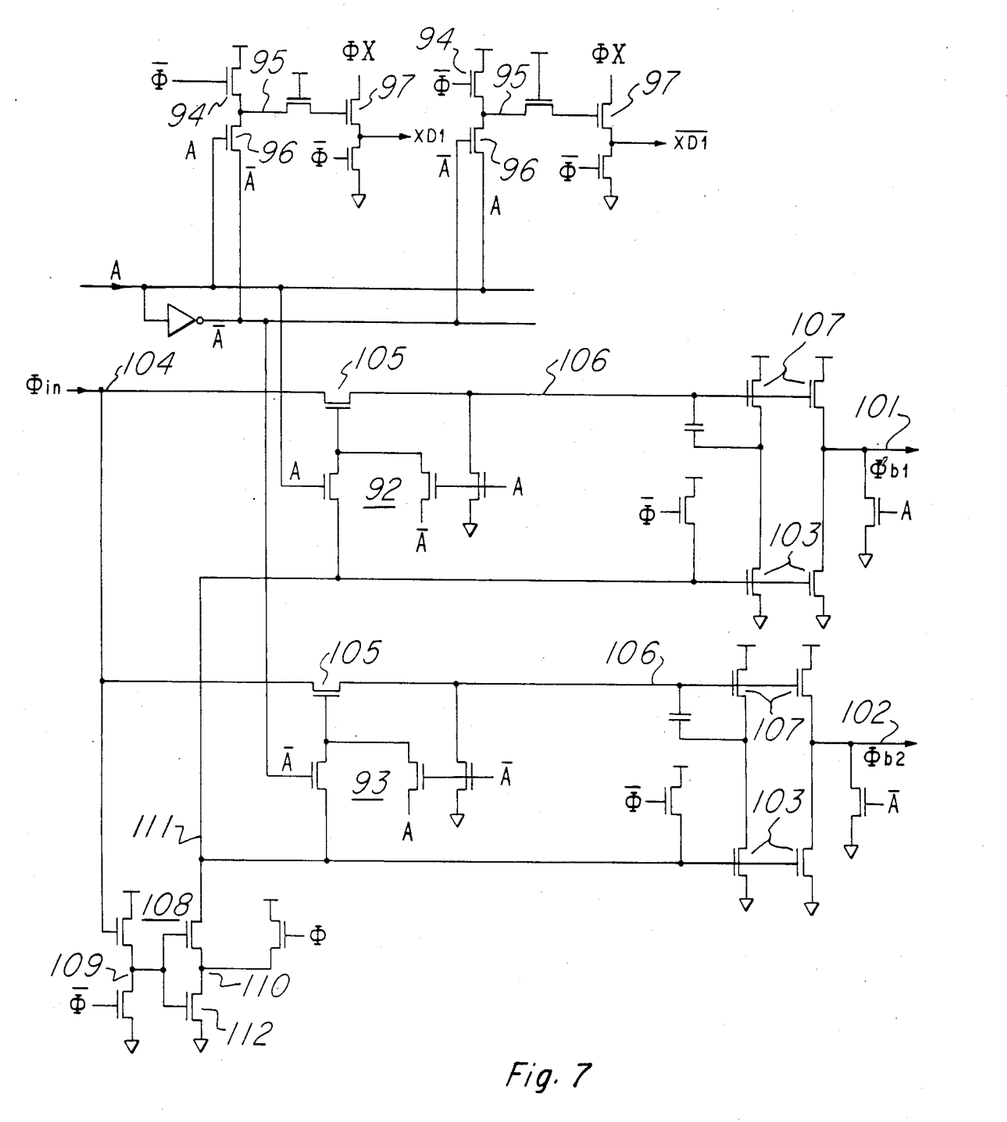
FIG. 7 is a schematic diagram of decoder circuits for selecting the active pull-up circuits in the device of FIGS. 1 and 5.

Referring to FIG. 7, circuits associated with the row decoder 12 for generating the dummy cell address voltages XD1 and XD1 for lines 73 and 74, and for generating the boost clocks $\Phi b1$ and $\Phi b2$, are illustrated. One of the address bits from the row address buffers 13 on lines 14, referred to here as A and its complement $\overline{A}$, is used in decoder circuits 90, 91, 92 and 93 to select XD1 or XD1, and to select Φb1 or Φb2. Each decoder 90 or 91 employs a precharge transistor 94 driven by a bar clock (such as $\overline{\Phi s}$) to precharge a node 95, then a combination of A and $\overline{A}$ on the source and gate of transistor 96 is used to conditionally discharge this node. Thus, a transistor 97 will conduct (or not conduct) a row address clock ΦX (derived from $\overline{RAS}$ delayed) to the dummy address line XD1 or XD1. A transistor 98 driven by Φ predischarges all the dummy cell address lines.

The boost clock generator of FIG. 7 employs two identical delay stages, one activated when the A bit is 1, the other when $\overline{A}$ is 1. Output nodes 101 and 102 are predischarged by the bar clock $\overline{\Phi}$ (such as $\overline{\Phi S}$) through transistors 103, then one is driven high a certain delay after Φin on node 104 goes high; Φin is defined from $\overline{RAS}$, etc., by delays. Transistors 105 are in series between node 104 and the gate node 106 of output transistors 107. The gate of one of the series transistors 105 is left high by an output from delay circuit 108. Nodes 109 and 110 of the delay circuit are predischarged by $\overline{\Phi}$, then when Φin goes high the node 111 is discharged after a time dependent upon the RC time constant of the source-drain path of transistor 112 and its gate capacitance. The decoders 92 and 93 allow only one of the series transistors 105 to conduct.

A decoded active pull-up scheme has been described which will significantly decrease active-cycle power consumption in dynamic RAM's in two ways. First, unneeded active pull-up circuits will not be activated. Secondly, the load on the boost clock generator, and thereby the size of the Φb1 and Φb2 driver transistors 107 is effectively cut by a factor of two by generating two parallel clocks, only one of which is active in any given cycle. This secondary power saving is significant when the sizes of the clock driver transistors are considered. The boost clock generator contributes a significant peak to the active-cycle current. This scheme is accomplished with minimum added circuitry and no performance degradation in other areas.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A dynamic semiconductor memory device comprising:

an array of rows and columns of memory cells, with all cells in each row connected to a row line and all cells in each column connected to a column line, each column line split into two bit lines, the two bit lines for each column being positioned side by side and the row lines being interleaved, a plurality of differential sense amplifiers, each sense amplifier having a pair of sense nodes, each sense amplifier being multiplexed for two separate columns by first and second pairs of coupling transistors, the first pair connecting the bit lines for one column to said sense nodes and the other pair connecting the bit lines for another column to said sense nodes;

a pair of active pull-up circuits for each sense amplifier, each said pull-up circuit connected to one of the bit lines for said one column on one side of a sense amplifier but not connected to the other side of said sense amplifier;

timing means to activate both said first and second pairs of coupling transistors during an active cycle and also to selectively activate said active pull-up circuits for the bit line containing the selected memory cell, while both the first and second pairs of coupling transistors are activated.

2. A device according to claim 1 wherein input/output conductor means is coupled only to said bit lines for said another column on the opposite sides of the sense amplifier from said active pull-up circuit.

3. A device according to claim 1 wherein a precharge and equalization circuit is connected to said bit lines on said one side of the sense amplifier but not on said other side.

4. A device according to claim 1 wherein said one column and said another column are positioned on opposite sides of the sense amplifier.

5. A dynamic semiconductor memory device comprising:

an array of rows and columns of memory cells, with all cells in each row connected to a row line and all cells in each column connected to a column line, each column line split into two bit lines, a plurality of dummy cells with a dummy cell connected to each of said bit lines, a plurality of differential sense amplifiers, each sense amplifier having two inputs connected to the bit lines for a column;

addressing means for addressing a selected row line for memory cells connected to one of said inputs of the sense amplifiers, and also for addressing a row of said dummy cells for bit lines on other of said inputs of the sense amplifiers, a pair of active pull-up circuits for each sense amplifier, each said active pull-up circuit connected to one of the bit lines for said column, said active pull-up circuits functioning to pull up a bit line if a memory cell is storing one, decoded timing means to selectively activate said active pull-up circuits during an active cycle only for bit lines for said one of said inputs to the sense amplifiers but not on the other side of said inputs.

6. A device according to claim 5 wherein input/output conductor means is coupled to said bit lines when said active pull-up circuits are activated.

7. A device according to claim 5 wherein a precharge and equalization circuit is also connected to said bit lines.

8. A dynamic semiconductor memory device comprising:

an array of rows and columns of memory cells, with all cells in each row connected to a row line and all cells in each column connected to a column line, each column line split into two bit lines, a plurality of dummy cells with each bit line being coupled to a dummy cell;

a plurality of differential sense amplifiers, each sense amplifier having two inputs connected to the bit lines for a column; means for addressing a selected row line and for activating dummy cells on bit lines for the inputs opposite the inputs having the bit lines for the selected row line;

a pair of active pull-up circuits for each sense amplifier, each said active pull-up circuit connected to one of the bit lines for said column; the active pull-up circuits pulling up the voltage of a bit line for a memory cell where a logic-one voltage is stored but not pulling up the voltage when a logic-zero is stored;

decoded timing means to selectively activate said active pull-up circuits during an active cycle only for said bit lines where a logic-one is stored but not the bit lines coupled to dummy cells and connected to said inputs opposite the selected row line; and input/output conductor means coupled to said bit lines only when said active pull-up circuits are activated.

* * * * *